(12) United States Patent
Katou et al.

(10) Patent No.: US 7,394,908 B2
(45) Date of Patent: Jul. 1, 2008

(54) APPARATUS AND METHOD FOR GENERATING HARMONICS IN AN AUDIO SIGNAL

(75) Inventors: Naoyuki Katou, Iizuka (JP); Yoshinori Kumamoto, Kasuya-Gun (JP); Jun Ikeda, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 729 days.

(21) Appl. No.: 10/647,380

(22) Filed: Aug. 26, 2003

(65) Prior Publication Data
US 2004/0071297 A1 Apr. 15, 2004

(30) Foreign Application Priority Data
Sep. 9, 2002 (JP) .............................. 2002-262558

(51) Int. Cl.
H03G 5/00 (2006.01)
(52) U.S. Cl. .............................. 381/98; 381/61; 381/101
(58) Field of Classification Search .................. 381/98, 381/61, 101, 102, 62; 84/622, 659, 692
See application file for complete search history.

(56) References Cited

U.S. PATENT DOCUMENTS

| | | | |
|---|---|---|---|
| 5,930,373 A | 7/1999 | Shashoua et al. | |
| 6,111,960 A * | 8/2000 | Aarts et al. | 381/61 |
| 6,285,767 B1 * | 9/2001 | Klayman | 381/17 |
| 6,792,115 B1 * | 9/2004 | Vierthaler | 381/61 |
| 6,792,119 B1 * | 9/2004 | Aarts | 381/98 |
| 6,845,165 B1 * | 1/2005 | Motohashi et al. | 381/98 |
| 6,961,435 B2 * | 11/2005 | Aarts et al. | 381/98 |
| 7,136,493 B2 * | 11/2006 | Coats et al. | 381/61 |

FOREIGN PATENT DOCUMENTS

| | | |
|---|---|---|
| WO | 99/25150 | 5/1999 |
| WO | 99/25151 | 5/1999 |

* cited by examiner

*Primary Examiner*—Vivian Chin
*Assistant Examiner*—Jason Kurr
(74) *Attorney, Agent, or Firm*—Wenderoth, Lind & Ponack, L.L.P.

(57) ABSTRACT

An audio-signal-processing apparatus includes a band-decomposition unit utilizing a band-decomposition characteristic based on the harmonic-tone composition of musical instruments. A low interval limit generates the harmonic-tone to each band signal after decomposing the bass signal into a plurality of band signals. The audio-signal processing apparatus generates a harmonic-tone individually for each pure tone component, which includes complex tones and suppresses deterioration of the sound quality.

14 Claims, 12 Drawing Sheets

| *1 | *2 | | frequency interval (Hz) | | | | | | | | |
|---|---|---|---|---|---|---|---|---|---|---|---|
| | | | | | | | | | | | *13 |
| 27.5 | A | 0 | | | | | | | | | 27.5 |
| 29 | A# | 0 | | | | | | | | | 29 |
| 31 | B | 0 | | | | | | | | | 31 |
| 33 | C | 0 | | | | | | | | | 33 |
| 35 | C# | 0 | | | | | | | | | 35 |
| 37 | D | 0 | | | | | | | | | 37 |
| 39 | D# | 0 | | | | | | | | | 39 |
| 41 | E | 0 | | | | | | | | | 41 |
| 44 | F | 0 | | | | | | | | | 44 |
| 46 | F# | 0 | | | | | | | | | 46 |
| 49 | G | 0 | | | | | | | | | 49 |
| 52 | G# | 0 | | | | | | | | | 52 |
| 55 | A | 1 | | | | | *8 | | | | 55 |
| 58 | A# | 1 | | | | | 29 | | | | 58 |
| 62 | B | 1 | | | | | 31 | | | | 62 |
| 65 | C | 1 | | | | | 33 | | | | 65 |
| 69 | C# | 1 | | | | | 35 | | | | 69 |
| 73 | D | 1 | | | | | 37 | | | | 73 |
| 78 | D# | 1 | | | | | 39 | | | | 78 |
| 82 | E | 1 | | | | | 41 | *9 | *10 | *11 | *12 | 82 |
| 87 | F | 1 | | | | | 44 | 51 | 60 | 68 | 78 | 87 |
| 92 | F# | 1 | | | | | 46 | 54 | 63 | 72 | 82 | 92 |
| 98 | G | 1 | | | | | 49 | 58 | 67 | 77 | 87 | 98 |
| 104 | G# | 1 | | | | | 52 | 61 | 71 | 81 | 92 | 104 |
| 110 | A | 2 | | *5 | *6 | | 55 | 65 | 75 | 86 | 98 | 110 |
| 117 | A# | 2 | | 30 | 39 | *7 | 58 | 68 | 79 | 91 | 103 | 117 |
| 123 | B | 2 | *4 | 32 | 41 | 51 | 62 | 72 | 84 | 97 | 110 | 123 |
| 131 | C | 2 | 25 | 34 | 44 | 54 | 65 | 77 | 89 | 102 | 116 | 131 |
| 139 | C# | 2 | 26 | 36 | 46 | 57 | 69 | 81 | 95 | 108 | 123 | 139 |
| 147 | D | 2 | *3 | 28 | 38 | 49 | 61 | 73 | 86 | 100 | 115 | 130 | 147 |
| 156 | D# | 2 | 19 | 29 | 40 | 52 | 64 | 78 | 91 | 106 | 122 | 138 | 156 |
| 165 | E | 2 | 20 | 31 | 43 | 55 | 68 | 82 | 97 | 112 | 129 | 146 | 165 |
| 175 | F | 2 | 21 | 33 | 45 | 58 | 72 | 87 | 102 | 119 | 137 | 155 | 175 |
| 185 | F# | 2 | 23 | 35 | 48 | 62 | 77 | 92 | 109 | 126 | 145 | 164 | 185 |
| 196 | G | 2 | 24 | 37 | 51 | 66 | 81 | 98 | 115 | 134 | 153 | 174 | 196 |
| 208 | G# | 2 | 25 | 39 | 54 | 70 | 86 | 104 | 122 | 142 | 162 | 184 | 208 |

*1: fundamental frequency (Hz)

*2: musical scale

*3: major 2nd

*4: minor 3rd

*5: major 3rd

*6: perfect 4th

*7: augmented 4th

*8: perfect 5th

*9: minor 6th

*10: major 6th

*11: minor 7th

*12: major 7th

*13: perfect 8th

Fig. 11(a) Prior Art harmonic-tone structure of musical sound (f is fundamental frequency)

Fig. 11(b) Prior Art chord of perfect 8th (f1:f2=1:2)

Fig. 11(c) Prior Art chord of perfect 5th (f1:f2=2:3)

Fig. 13(a)    Prior Art
(original waveform)

zerocrossing point with
cycle T interval

Fig. 13(b)    Prior Art
(ideal)

no waveform distortion

Fig. 13(c)    Prior Art
(after processing)

waveform distortion

APPARATUS AND METHOD FOR GENERATING HARMONICS IN AN AUDIO SIGNAL

BACKGROUND OF THE INVENTION

1. Field of the Invention

This invention relates to an audio-signal-processing apparatus capable of harmonic-series-generation and a method thereof.

2. Description of the Related Art

Audio-signal-processing apparatuses with harmonic-series-generation have been proposed for various purposes. Generally known is, for example, an effector apparatus that gives variations to tone color of a musical instrument and voice, especially, a virtual reproduction system of bass sound that generates a harmonic-tone for a bass component to reinforce the bass sounds in a small speaker.

Figure 9A:
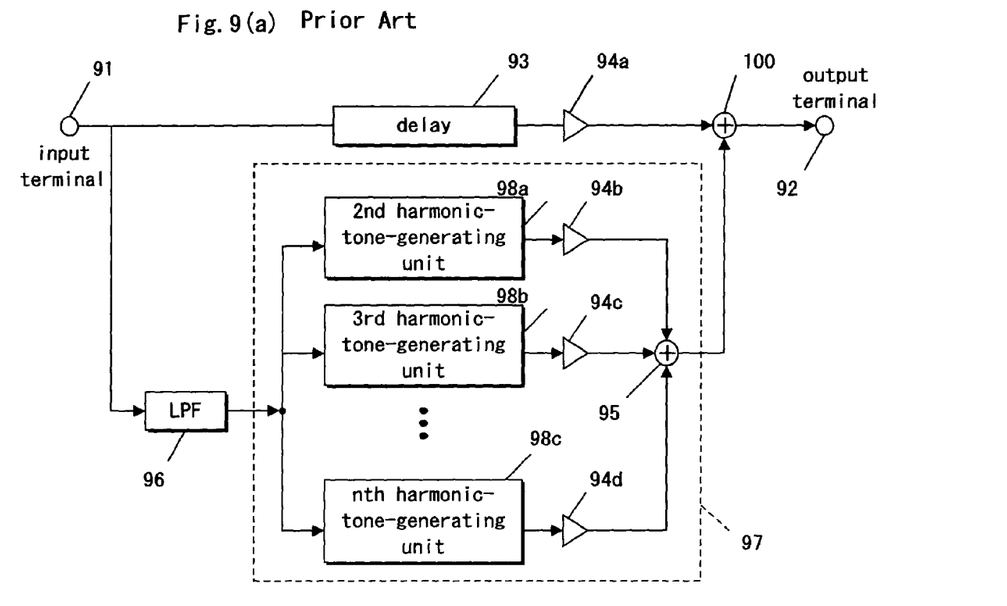
Figure 9B:
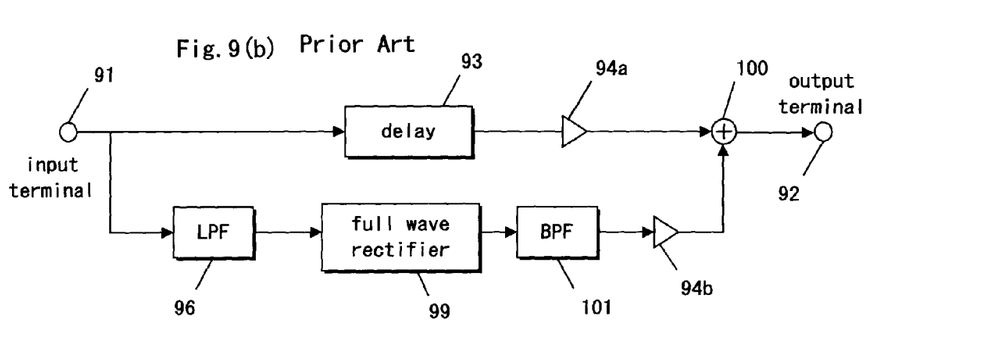

A prior art virtual reproduction system of bass sound will be described with reference to FIG. 9 through FIG. 13. FIGS. 9 (a) and (b) are block diagrams illustrating a conventional audio-signal-processing apparatus. Each harmonic-tone can be generated with a full-wave-rectification method, a power method, a zerocrossing method or other similar method.

A first example of a prior art system will be described with reference to FIG. 9 (a). In this example, a plurality of harmonic-tone components of integer orders are generated with the zerocrossing method or the power method for low frequency components.

As illustrated in FIG. 9 (a), a signal inputted from an input terminal 91 is divided into two systems. In the first system, all the components of the input signal are inputted into a delay unit 93, and the output of the delay unit is then inputted into one input of an adder 100 after undergoing gain adjustment by a gain-control 94a. The components of the input signal are delayed by a time that is required for processing in a harmonic-series-generating unit 97, whose processing will be described later.

In the second system, all the components of the input signal are inputted into a low pass filter 96. The low pass filter 96 extracts only low frequency components from all these components according to a predetermined cut-off characteristic of the low pass filter 96, and outputs the extracted low frequency components to harmonic-series-generating unit 97.

Throughout this specification, a harmonic-tone with n times the frequency (n is a natural number) of the fundamental tone frequency (fundamental frequency) is referred to as an n-th harmonic-tone.

The harmonic-series-generating unit 97 includes harmonic-series-generating units 98a, 98b, . . . , 98c that generate a 2nd harmonic-tone, a 3rd harmonic-tone, . . . , an n-th harmonic-tone for the low frequency components that the low pass filter 96 has extracted. The 2nd harmonic-tone and the 3rd harmonic-tone, . . . , the n-th harmonic-tone that these harmonic-series-generating units 98a, 98b, . . . , 98c generate are inputted into another input of the adder 100 after undergoing gain adjustment by gain controls 94b, 94c, . . . , 94d respectively and then added in an adder 95.

The adder 100 adds the components inputted from the first system and the second system respectively and outputs the sum to an output terminal 92.

Another example of a prior art system will be described with reference to FIG. 9 (b). In this example, a harmonic-tone is generated for the low frequency component with the full-wave-rectification method. Japanese Patent Publication No. 05-328481 discloses a circuit pertaining to the second example.

In FIG. 9 (b), the explanation is omitted for the same components described in and with reference to FIG. 9 (a).

In FIG. 9 (b), the harmonic-series-generating unit 97 illustrated in the FIG. 9 (a) is replaced with a full wave rectifier 99 and a band pass filter 101.

The full wave rectifier 99 changes negative values of the low frequency signals that a low pass filter 96 has extracted to positive values, doubling the frequency of the low frequency signals. However, since direct-current bias and even harmonic-tone components are actually generated, only the 2nd harmonic-tone that is a principal component, is extracted using the band pass filter 101.

Figure 9C:
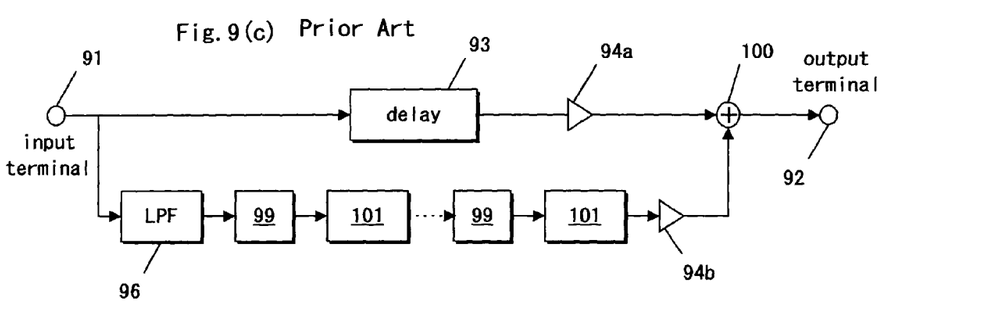

As illustrated in FIG. 9 (b), full-wave-rectification can be executed with a simple structure. The full-wave-rectification system can generate a second harmonic-tone and be expanded to generate harmonic-series on the order of an n-th power of 2 (n=2, 3, . . . ) by cascading plural units of the full-wave-rectification 99 and using a band pass filter 101 as illustrated in FIG. 9 (c). However, this full-wave-rectification system poses a problem in that odd harmonic-tones cannot be generated.

Figure 10A:
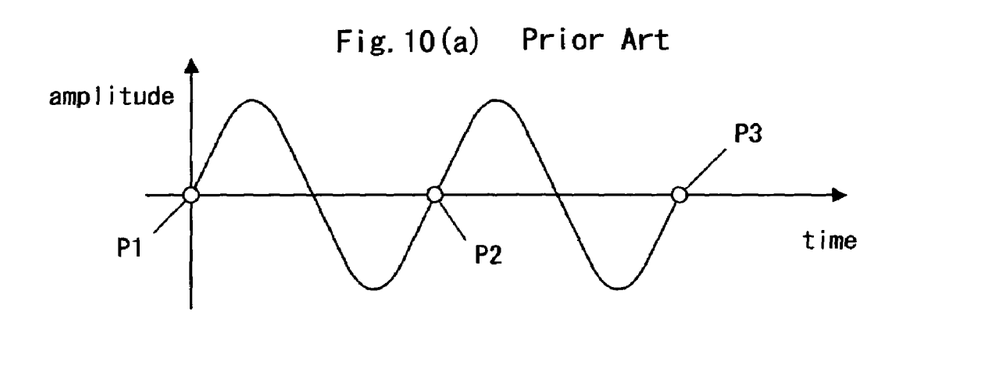
Figure 10B:
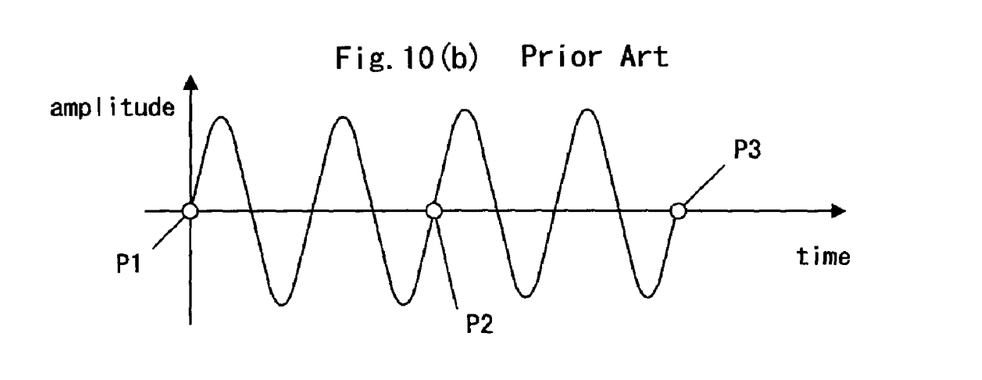

Next, problems associated with the zerocrossing method and the first example in the prior art will be described with reference to FIG. 10. FIGS. 10 (a) and (b) illustrate graphs exemplifying waveforms resulting from the prior art zerocrossing method the prior art. In the figures, the horizontal axis illustrates time and the vertical axis indicates amplitude.

The zerocrossing method detects the zerocrossing points P1, P2, and P3 as the signal changes from positive to negative or from negative to positive. These detected zerocrossing points are illustrated by the circles depicted in FIG. 10 (a).

In generating the second harmonic-tone component, a signal is double-compressed in the time axis and repeatedly reproduced twice in an interval between one zerocrossing point and the next zerocrossing point (for example, an interval between P1 and P2 or an interval between P2 and P3, in FIG. 10 (a)).

Similarly, an n-th order harmonic-tone is obtained by compressing a signal n times and repeatedly reproducing the signal n times in an interval between two consecutive zerocrossing points on the time axis.

Figure 11A:
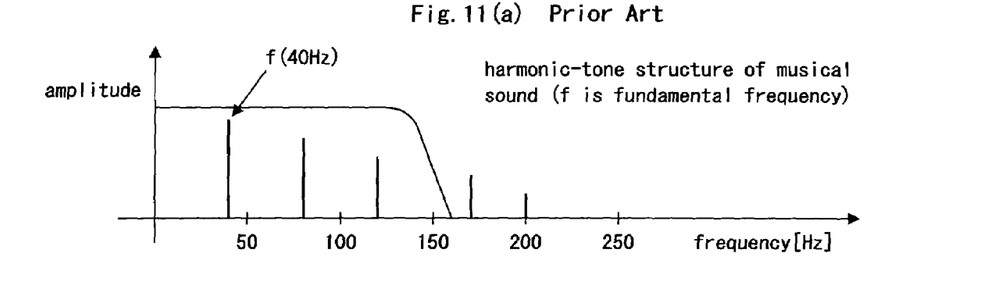

A general music source is a complex tone that includes a plurality of pure tone components. For example, a periodical musical sound is includes a fundamental tone with (f=40 Hz in FIG. 11 (a)) and harmonic-tones with frequencies of integral multiples of the fundamental frequency (80, 120 . . . Hz), as illustrated in spectrum structure examples in FIG. 11 (a).

Figure 11B:
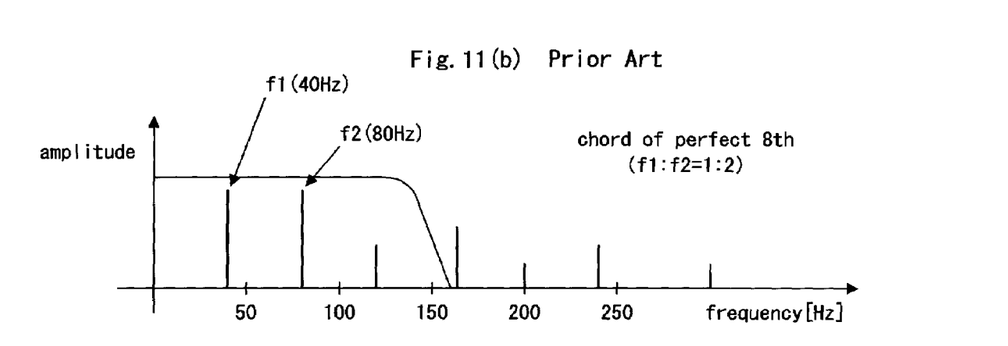
Figure 11C:
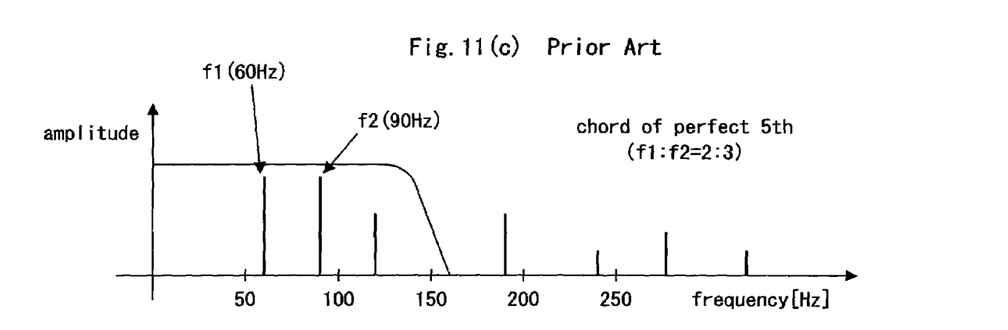

Further, a chord possesses a plurality of fundamental frequencies with strong energy components. For example, the chord possesses the spectrum structure illustrated in FIG. 11 (b) in Perfect 8th, and the spectrum structure illustrated in FIG. 11 (c) in Perfect 5th.

Next, problems encountered when using conventional harmonic-series-generating methods for such general complex tones (including a plurality of pure tones) will be described. Hereafter, a zerocrossing method used as a harmonic-series-generating method will be described. Additionally, problems encountered when using other harmonic-series-generating methods, such as the full-wave-rectification method and the power methods, will be described.

Figure 12A:
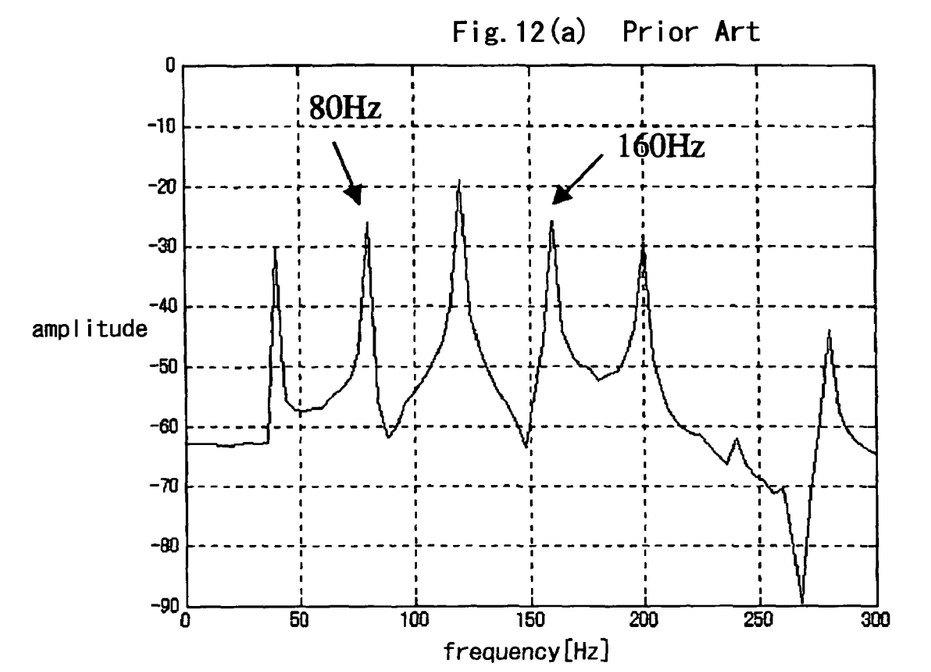

FIG. 12 (a) illustrates the results of the frequency analysis performed on the processed sounds, after generating the 2nd harmonic-tone at the same level as the original signal, by the zerocrossing method for complex tones (refer to FIG. 11 (b) regarding its spectrum structure). The complex tones include two pure tones (pure tones of 40 Hz and 80 Hz of the same level) that are in the Perfect 8th relation (the frequency ratio is 1:2).

Figure 12B:
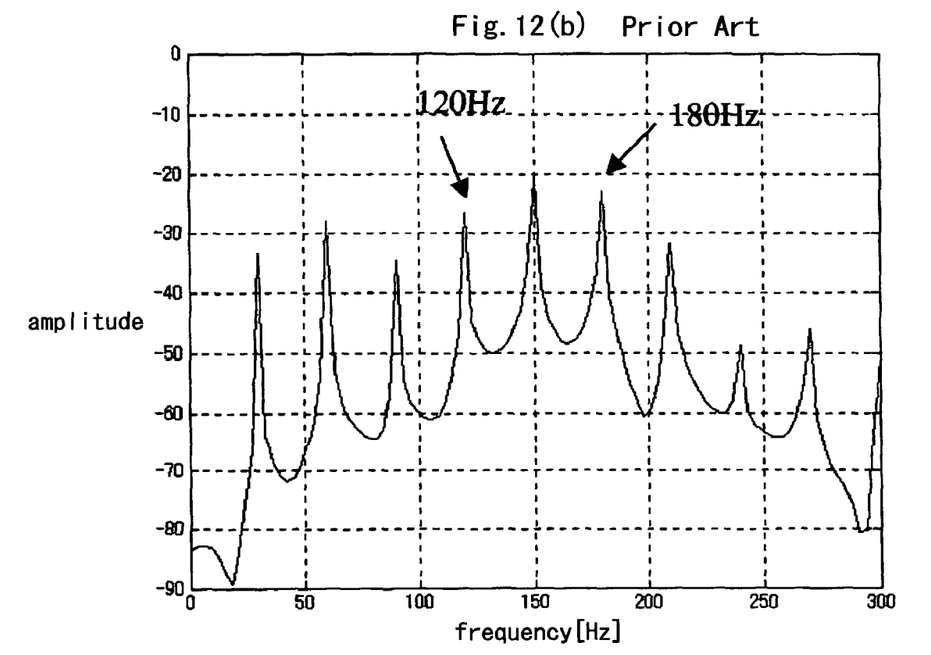

FIG. 12 (b) illustrates the results of the frequency analysis performed on the processed sounds, after generating the 2nd harmonic-tone at the same level as the original signal, by the zerocrossing method for complex tones (refer to FIG. 11 (c) regarding its spectrum structure). The complex tones include two pure tones (pure tone of 60 Hz and 90 Hz of the same level) that are in the Perfect 5th relation (the frequency ratio is 2:3).

It is desirable for the processed sounds to possess only the second harmonic components of each pure tone component in both FIGS. 12 (a) and (b). However, although the second harmonic components are generated in either case, some distortions occurs due to the inclusion of other components than the second harmonic components (e.g., the fundamental frequency equal to the highest common factor of the fundamental frequency of two pure tone components). This distortion occurs since the harmonic-tone is generated at once for the signal with a plurality of pure tones.

Figure 13A:
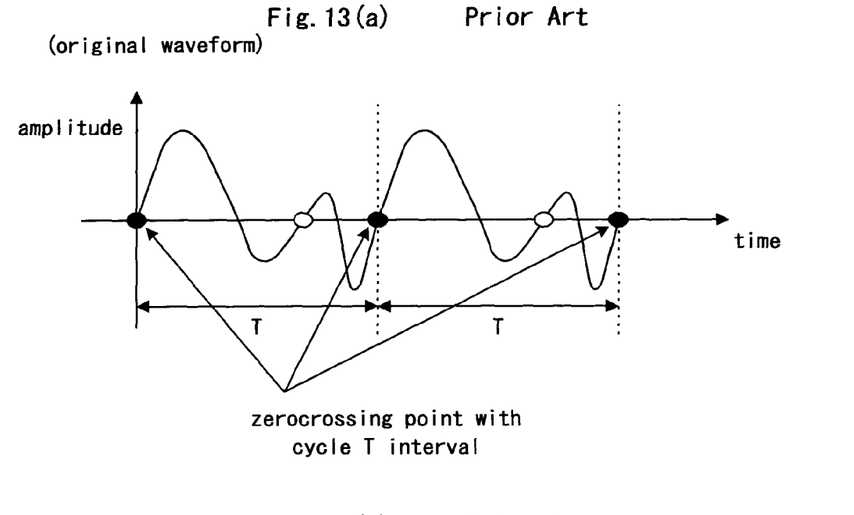

As illustrated in FIG. 13 (a), in a signal with a plurality of pure tones, the waveform cycle T of the complex tone (the least common multiple of the contained pure tone cycles) and the interval of the zerocrossing points in the original waveform do not usually agree with each other.

Figure 13B:
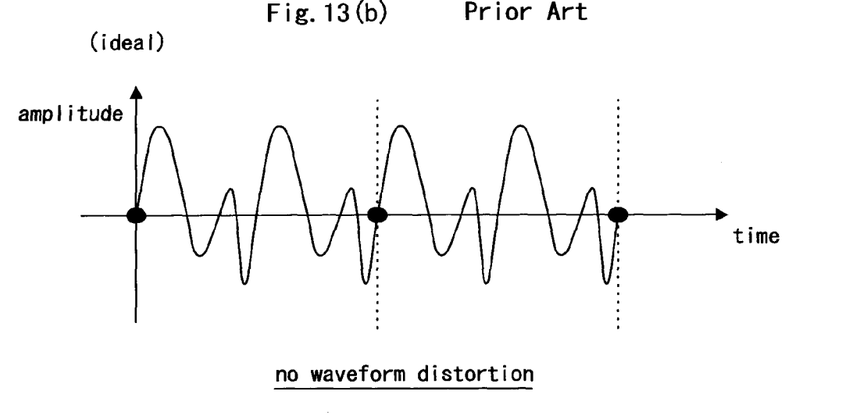
Figure 13C:
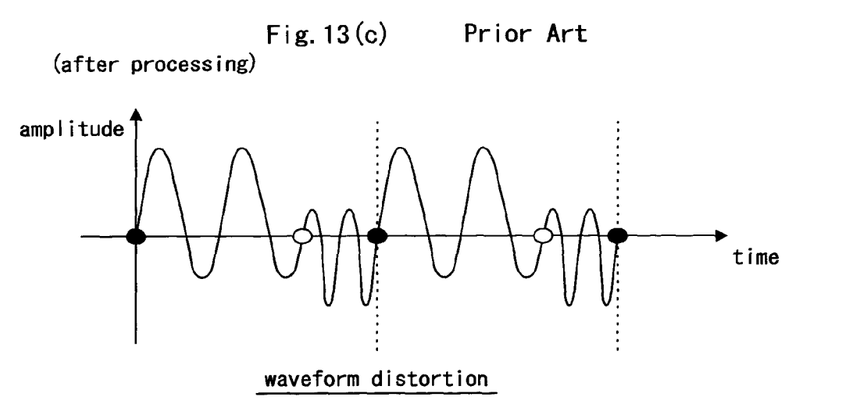

For such a case, applying the zerocrossing method compresses the waveform and makes reproduction repeatedly in other interval than the zerocrossing points with cycle T, as illustrated in FIG. 13 (c). As a result, the processed signal waveform is not similar to the original signal and waveform distortion occurs. Comparing FIG. 13 (b) with FIG. 13 (c), FIG. 13 (b) illustrates the waveform that has the ideal harmonic-series-generation of the original waveform of FIG. 13 (a). Therefore, there is a need to overcome or lessen the disadvantages noted above in the prior art.

SUMMARY OF THE INVENTION

An object of the present invention is to provide an audio-signal-processing apparatus that can suppress sound quality degradation in a complex tone and a method thereof.

A first aspect of the present invention provides an audio-signal-processing apparatus that includes a band-decomposition unit, having a decomposition characteristic, operable to decompose a low frequency component of input-audio-signals into a plurality of frequency components that have different frequency bands based on the decomposition characteristic. A harmonic-series-generating unit is operable to generate a harmonic-tone component based on at least one of the plurality of frequency components, and a composition unit is operable to compound the input-audio-signals and the harmonic-tone component generated by the harmonic-series-generating unit.

Since the band-decomposition unit decomposes the low frequency component into a plurality of narrow frequency bandwidths, the fundamental tone and the harmonic-tones thereof that belong to a same band are suppressed There fore, the distortion can be restrained and sound quality can be improved.

A second aspect of the present invention provides an audio-signal-processing apparatus as defined in the first aspect of the present invention, wherein the band-decomposition unit is operable to decompose the low frequency component of the input-audio-signals such that each of a fundamental tone and harmonic-tones of the fundamental tone belong to a different frequency band. With this structure, the fundamental tone and the harmonic-tones thereof do not belong to a same band, thereby the distortion can be restrained and sound quality can be improved.

A third aspect of the present invention provides an audio-signal-processing apparatus as defined in the first aspect of the present invention, wherein the decomposition characteristic is defined based on a lowest fundamental frequency of musical instruments. With this apparatus the band-decomposition unit decomposes the low frequency component according to actual circumstances.

A fourth aspect of the present invention provides an audio-signal-processing apparatus as defined in the first aspect of the present invention, wherein the decomposition characteristic is defined based on a low interval limit. With this structure, the decomposition characteristic for band-decomposition can be optimized, and the circuit scale can be reduced.

A fifth aspect of the present invention provides an audio-signal-processing apparatus as defined in the first aspect of the present invention, wherein each band width of the different frequency bands is from 15 Hz to 30 Hz. With this structure, the decomposition characteristic is adapted to the low interval limit.

A sixth aspect of the present invention provides an audio-signal-processing apparatus as defined in the first aspect of the present invention, but includes further a delay device operable to compensate processing delay between the harmonic-tone component and the input-audio-signals. With this structure, the generated harmonic-tone components and the input-audio-signals can be adjusted on the time axis of the reproduced sound. A seventh aspect of the present invention provides an audio-signal-processing apparatus as defined in the first aspect of the present invention, but further includes a gain control device operable to adjust a gain of the input-audio-signals and a gain of the harmonic-tone component generated by the harmonic-series-generating unit. With this structure, a level ratio of the generated harmonic-tone component and the input-audio-signals can be changed; thereby a plurality of reinforcement effect modes related to the bass sounds can be set.

An eighth aspect of the present invention provides an audio-signal-processing including a sum component output unit operable to input input-audio-signals of a first channel and input-audio-signals of a second channel to output a sum component of the audio signals of the first channel and the input-audio-signals of the second channel. A band-decomposition unit, having a decomposition characteristic, is operable to decompose the sum component into a plurality of frequency components that have different frequency bands based on the decomposition characteristics. A harmonic-series-generating unit is operable to generate a harmonic-tone component based on at least one of the plurality of frequency components. A first composition unit is operable to compound the input-audio-signals of the first channel and the harmonic-tone component generated by the harmonic-series-generating unit; and a second composition unit is operable to compound the input-audio-signals of the second channel and the harmonic-tone component generated by said harmonic-series-generating unit.

This structure provides the same advantage as the first aspect of the invention, but in addition, this structure utilizes human audibility characteristics that are dull at localization of sound image in low frequencies. The fact that low frequency components are often contained in-phase in each channel, reinforcement of the bass sounds can be realized on a smaller circuit scale when processing the input-audio-signals of two or more channels. The above, and other objects, features and advantages of the present invention will become apparent

BRIEF DESCRIPTION OF THE DRAWINGS

FIGS. 1 (a), (b), and (c) are block diagrams illustrating an audio-signal-processing apparatus according to an embodiment of the present invention;

FIGS. 5 (a)-(d) are exemplified illustrations showing a band-decomposition according to an embodiment of the present invention;

FIGS. 6 (a)-(d) are exemplified illustrations showing a band-decomposition according to an embodiment of the present invention;

FIGS. 7 (a)-(d) are exemplified illustrations showing a band-decomposition according to an embodiment of the present invention;

FIGS. 9 (a)-(c) are block diagrams illustrating a conventional audio-signal-processing apparatus;

FIG. 10 (a) is a descriptive illustration showing how a prior art zerocrossing method generates a harmonic-tone (original waveform);

FIG. 10 (b) is a descriptive illustration showing how the prior art zerocrossing method generates the harmonic-tone (generated waveform);

FIGS. 11 (a)-(c) are descriptive illustrations showing a chord spectrum structure;

FIGS. 12 (a) and (b) are illustrations showing a spectrum of the result of the prior art of the harmonic-series-generation (complex tone);

FIG. 13 (a) is a descriptive illustration showing how the prior art zerocrossing method generates the harmonic-tone (original waveform);

FIG. 13 (b) is a descriptive illustration showing how the prior art zerocrossing method generates the harmonic-tone (generated waveform); and FIG. 13 (c) is a descriptive illustration showing how the prior art zerocrossing method generates the harmonic-tone (ideally generated waveform).

DETAILED DESCRIPTION OF THE PREFERRED EMBODIMENTS

Figure 1A:
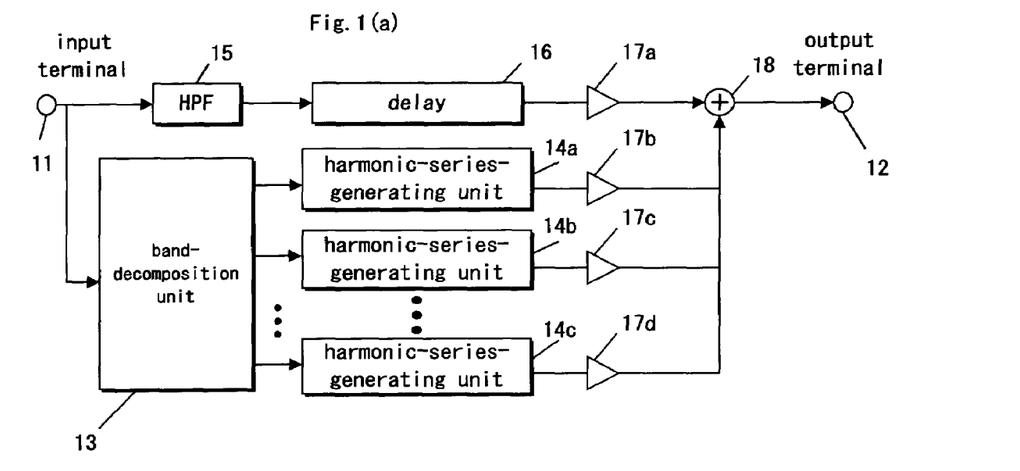

Preferred embodiments of the present invention are now described in conjunction with the accompanying drawings. FIG. 1 (a) is a block diagram illustrating an audio-signal-processing apparatus according to an embodiment of the present embodiment. An input terminal 11, illustrated in FIG. 1, inputs an input-audio-signal. A band-decomposition unit 13 has a decomposition characteristic, and it decomposes the low frequency components of the input-audio-signal into a plurality of frequency components that have different frequency bands based on the decomposition characteristic.

A plurality of harmonic-series-generating units 14a-14c generate harmonic-tone components for each band signal decomposed by the band-decomposition unit 13. As a harmonic-series-generating method, any harmonic-tone-component method previously described (e.g. the full-wave-rectification method, the power method, the zerocrossing method, etc.) can be used.

However, the numbers and amplitude levels of the harmonic-tone components in each frequency band are set to desirable values based on a listening test and so on.

A high-pass filter 15 is a digital filter with a high-pass characteristic and removes the components within the frequency bands to be virtualized from the input-audio-signal.

A delay device 16 compensates for the processing delay. Gain controls 17a-17d adjust the gain for the output signals of harmonic-series-generating units 14a-14c and the delay device 16. An adder 18 adds the output signals of the gain control 17a-17d, and the added result is outputted to the exterior from an output terminal 12.

The band-composition unit 13 decomposes the low frequency components into a plurality of frequency band signals (hereafter referred as the band signal). In the digital-signal-processing art, methods to generate the band signals are generally known; a band pass filter, Fourier transformation, and wave let conversion, etc. may be used.

Figure 2:
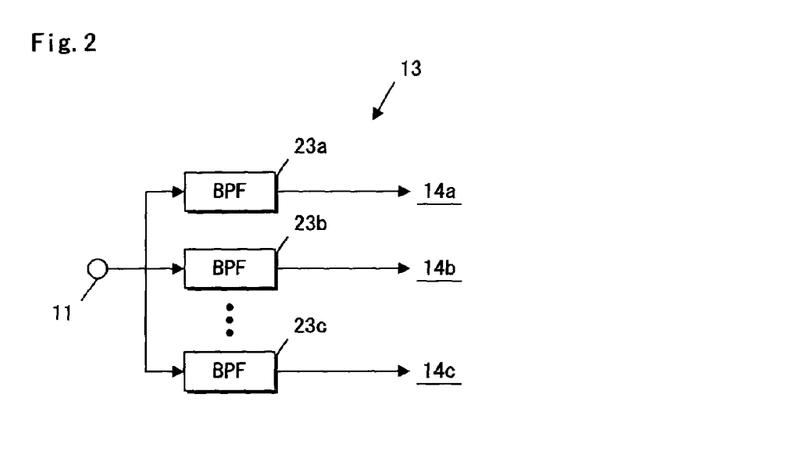
FIG. 2 is a block diagram illustrating a band-composition unit according to an embodiment of the present invention.

The band-decomposition unit 13 in the present invention is enough to decompose the bands following the condition 1 described later and it does not depend on the composition itself. As illustrated in FIG. 2, setting a plurality of band pass filters 23a, 23b . . . 23c in parallel according to the bandwidth comprises the band-decomposition unit 13.

The decomposition characteristic of the band-decomposition unit 13 is included so that a plurality of pure tone components are not contained in each frequency band to suppress the sound quality deterioration in complex tones. The details how to determine such a decomposition characteristic will be described later.

Figure 1B:
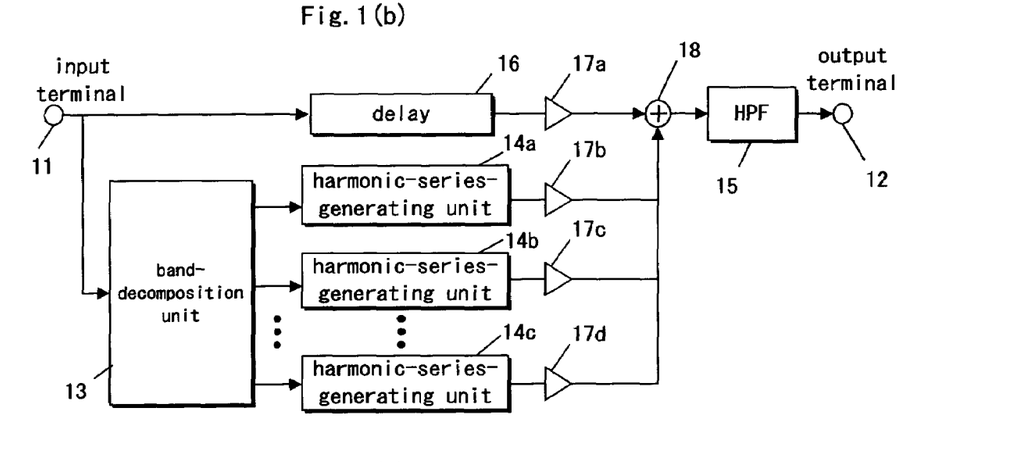

As an alternative to the system illustrated in FIG. 1 (a), the components of the frequency band to be virtualized from the original signal can be removed via the high pass filter 15 connected to the output of the adder 18, as illustrated in FIG. 1 (b).

Figure 1C:
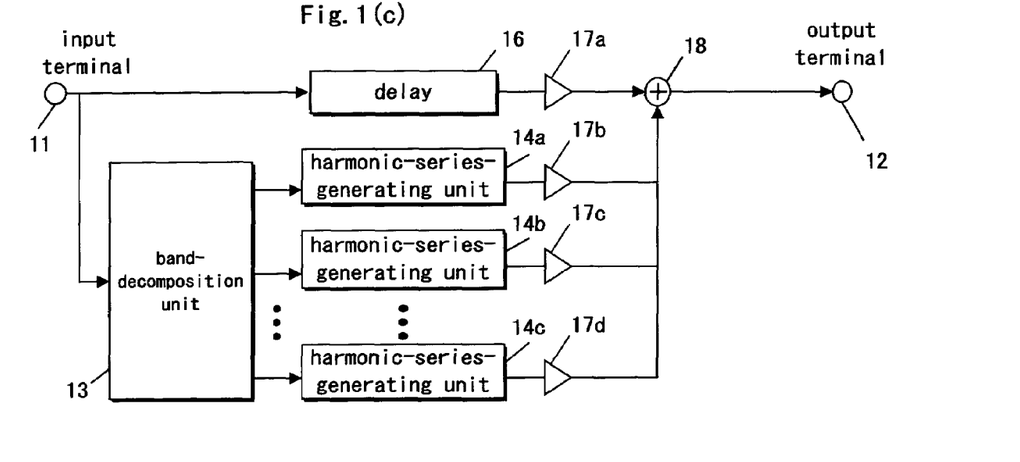

Additionally, as another alternative to the system illustrated in FIG. 1 (a), there is no practical problem to omit the high pass filter 15, as illustrated in FIG. 1 (c). However, the original frequency components still remain.

Figure 3:
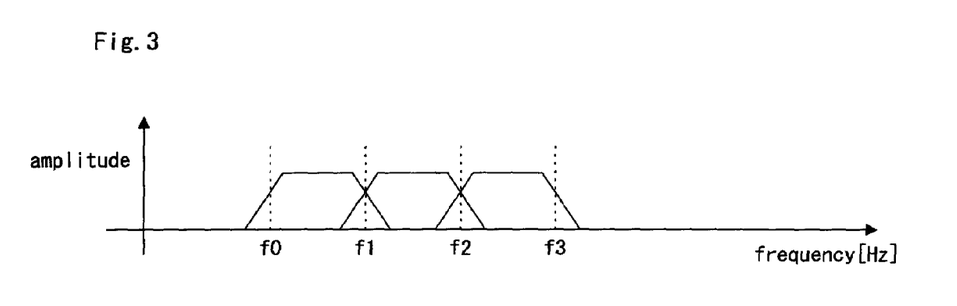
FIG. 3 is a descriptive illustration showing a band-decomposition according to an embodiment of the present invention.

Next, the operations of the system noted above will be described. The decomposition characteristic illustrated in FIG. 3 is simplified such as [f0 Hz f1 Hz f2 Hz f3 Hz]. This expression means that there are three bands such as an f0 Hz-f1Hz band, an f1 Hz-f2 Hz band, and an f2 Hz-f3 Hz band.

In the following, a case is described where the total bandwidths of the three bands, (e.g., the frequency band of [f0 Hz f3 Hz] as illustrated in FIG. 3) are to be generated. In the following example, it is assumed that f0=0, f1=50, f2=75, and f3=100.

First, as illustrated in FIG. 1 (a), the input-audio-signal is inputted into the band-decomposition unit 13 through the input terminal 11.

The band-decomposition unit 13 extracts the low frequency component from the input-audio-signal and decomposes its component into the frequency band signals (hereafter referred to the band signal) of [0 Hz 50 Hz], [50 Hz 75 Hz], [75 Hz 100 Hz].

The harmonic-tone components are generated for the each band signal by the harmonic-series-generating units 14a-14c.

The input-audio-signal that is to be recomposed with the output signals of the harmonic-series-generating units 14a-14c, is attenuated in the frequency band components of [f0Hz f3 Hz] by the high pass filter 15, and delayed by the delay device 16, in order to compensate for the delay produced by the harmonic-series-generating process of the low frequency component.

The gains of the output signal of the harmonic-series-generating units 14a-14c and the output signal of the delay device 16 are adjusted adequately by the gain adjustment units 17a-17d. The adjusted signals are added by the adder 18 and are outputted to the exterior through the output terminal 12.

Decomposing the whole bands into a plurality of narrow bands makes it feasible to generate the harmonic-tone components individually for each pure tone component that includes the complex tone, thus suppressing the sound quality deterioration in the complex tone.

However, if the decomposing number of the bands increases, the number of harmonic-series-generating units and narrower band filters can be increased resulting in increased circuit scale.

Therefore, considering the reduction of the circuit scale while maintaining sound quality, it is an optimal decomposition characteristic that has the widest band width to be able to separate each purer tone component.

The followings will describe the situation in which each decomposing bandwidth is determined based on the harmonic-tone composition of the musical sound and the low interval limit.

1. Harmonic-Tone Composition of Musical Sound

Periodical complex tones like musical sound are comprised of a fundamental tone with fundamental frequency and harmonic-tones with the frequencies of integral multiple.

The lowest fundamental frequency differs with musical instruments. The following list includes the lowest fundamental frequencies of exemplary bass musical instruments (hereafter referred to the lowest fundamental frequency).

Musical Instruments with the Lowest Fundamental Frequency (Hz)

Piano—27.5

Bass guitar—(five bowstrings) 30.8

Contrabass—34.6

Bus tuba—41.2

Bus saxophone—55.0

According to the above list, the fundamental frequency of the piano (27.5 Hz) is the lowest for the bass musical instruments. Therefore, the decomposition characteristic should correspond to a fundamental frequency equal to or higher than 27.5 Hz.

Since the harmonic-tone components contained in musical sound exist generally in the higher degrees like the 2nd, the 3rd, and the 4th . . . , it is desirable that the fundamental tone and the each harmonic-tone component are separated respectively.

Considering the above, it is enough if the following Condition 1 is fulfilled for each fundamental frequency of 27.5 Hz or higher.

(Condition 1) The fundamental tone with a fundamental frequency (frequency f) and a harmonic-tone for the fundamental tone (frequency nf; n being a natural number) are not contained in the same decomposing band (i.e., the fundamental tone with a fundamental frequency and a harmonic-tone for the fundamental tone belong to different frequency bands).

2. Setting based on Low Interval Limit

A chord has a plurality of fundamental frequencies. Therefore, in order to separate each pure tone component in the chord, it is required to separate the fundamental frequency of each fundamental tone and its harmonic-tone components.

In a lower register, there exists a characteristic related to the audibility of a chord with respect to fundamental frequencies that produces muddy sounds without harmonizing.

There is a limit related to two sounds with a determined interval, which if produced in a register lower than this, would sound muddy. This limit is called a low interval limit. Because of the low interval limit, the fundamental frequencies produced are simultaneously restricted.

Figure 4:
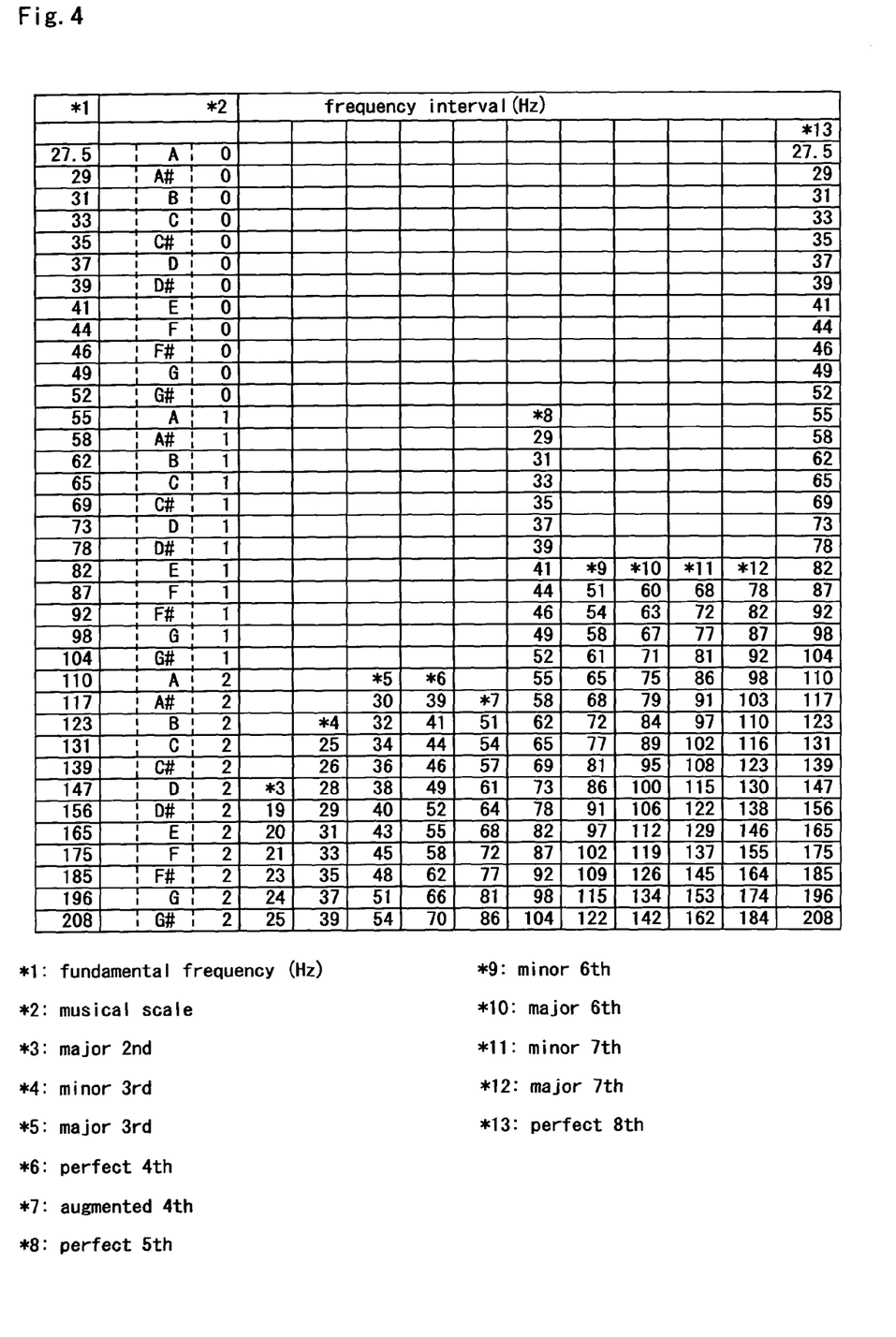
FIG. 4 is a descriptive illustration showing a frequency interval that takes into consideration a low interval limit according to an embodiment of the present invention.
Figure 5A:
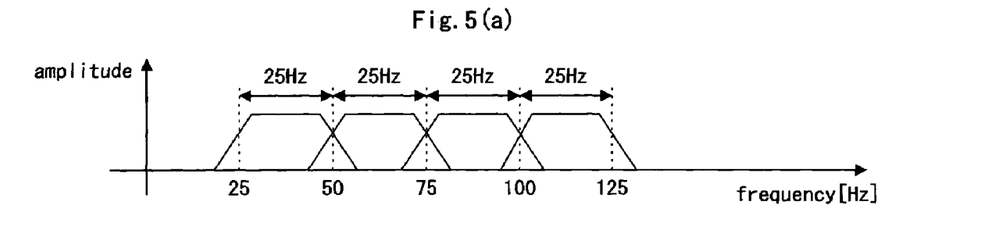
Figure 5B:
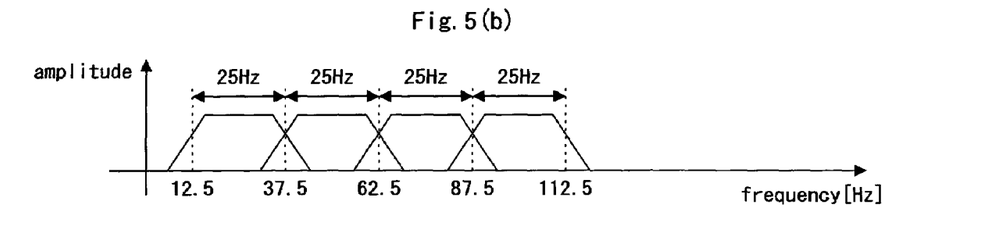
Figure 5C:
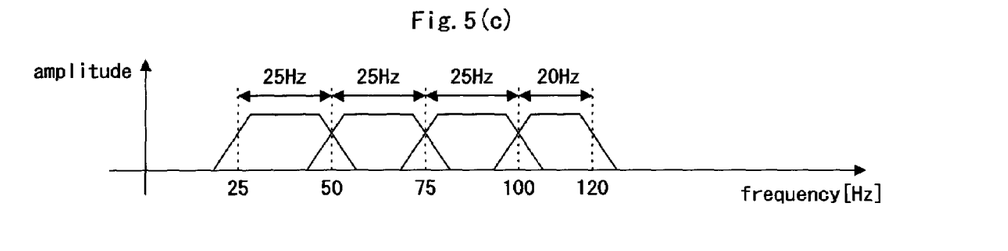
Figure 5D:
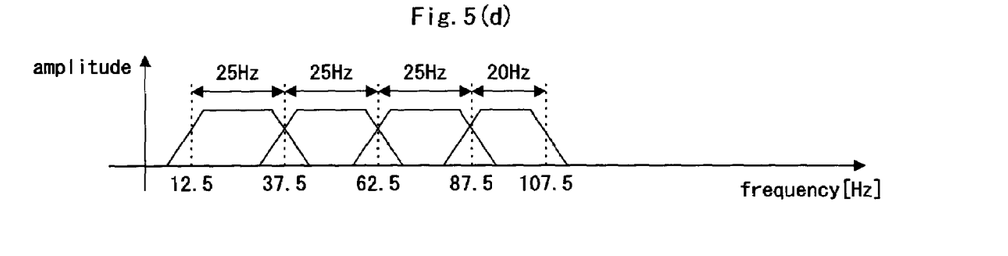

FIG. 4 illustrates calculated frequency intervals of the fundamental frequencies based on the low interval limit. The relationships among the fundamental frequency, the musical scale and the frequency interval are also summarized in FIG. 4. In FIG. 4, the interval of only Perfect eighth in A0-A1, Perfect fifth and Perfect eighth in A1#-A2, the interval higher than Major 3rd except Augmented 4th in A2#-B2, the interval higher than Minor 3rd in C2-D2, and the interval higher than Major 2nd in higher than D2# are used.

The suffix attached to the interval name expresses the octave number, and A0 corresponds with 27.5 Hz that is the lowest fundamental tone of a piano.

If the Condition 1 is fulfilled regarding the fundamental frequency higher than 29 Hz, the conditions of the low interval limit can also be fulfilled.

For example, Perfect fifth (the frequency ratio is 2:3) is used from 58 Hz. The 58 Hz is a 2nd harmonic-tone of 29 Hz and the frequency of 87 Hz of a 3rd harmonic-tone has the frequency ratio of Perfect fifth for the 2nd harmonic-tone.

That is, Perfect fifth is equal to the frequency ratio of the 2nd harmonic-tone and the 3rd harmonic-tone, and the lowest frequency 58 Hz that Perfect fifth is used corresponds with the 2nd harmonic-tone of 29 Hz. Therefore, if the fundamental frequencies higher than 29 Hz fulfill the Condition 1, the fundamental frequency that is in the relation of Perfect fifth higher than 58 Hz is separable.

This also corresponds to Perfect eighth (the frequency ratio of the fundamental frequency and the 2nd harmonic-tone) and Major 3rd (the frequency ratio of the 4th harmonic-tone and the 5th harmonic-tone). After all, if the Condition 1 is fulfilled regarding the fundamental frequency higher than 29 Hz, the fundamental frequency that interferes with bass chords is also separable.

Next, the practical examples of the decomposition characteristic that fulfill the Condition 1 will be described. The lowest fundamental frequency here is 27.5 Hz, which is the lowest fundamental frequency of a piano.

As a simple example of fulfilling the Condition 1, each bandwidth narrower than 27.5 Hz is uniformly made. However, since ideal band-decomposition without a crossover is impossible, the bandwidth narrower than 27.5 Hz will be practically set.

As examples of such decomposition, the bandwidths of [25 Hz 50 Hz 75 Hz 100 Hz 125 Hz] and [12.5 Hz 37.5 Hz 62.5 Hz 112.5 Hz] are illustrated in FIGS. 5 (a) and (b) respectively.

As illustrated in the bandwidths of [25 Hz 50 Hz 75 Hz 100 Hz 107.5 Hz][12.5 Hz 37.5 Hz 62.5 Hz 87.5 Hz 107.5 Hz] in FIGS. 5 (c) and (d) respectively, each bandwidth needs not necessarily be equal.

Figure 6A:
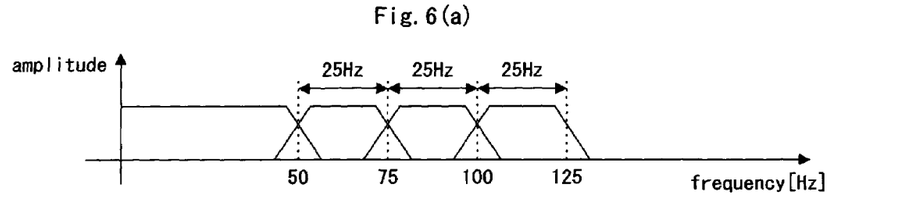
Figure 6B:
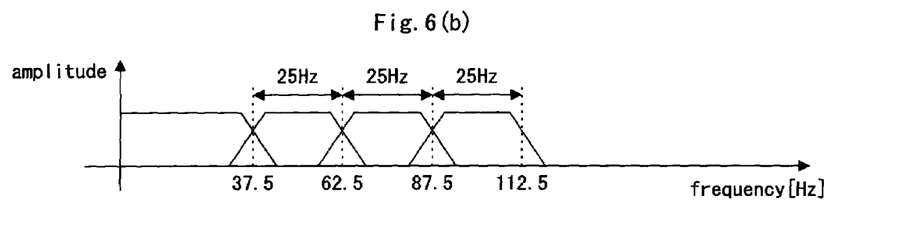
Figure 6C:
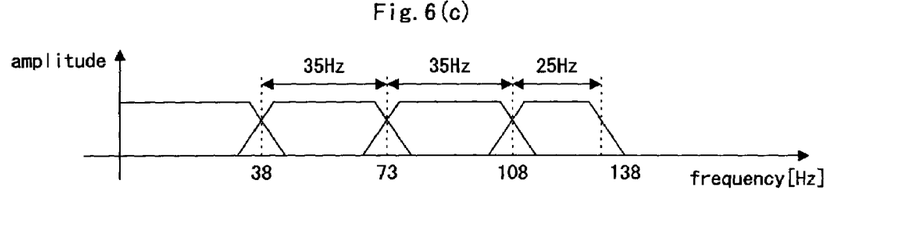
Figure 6D:
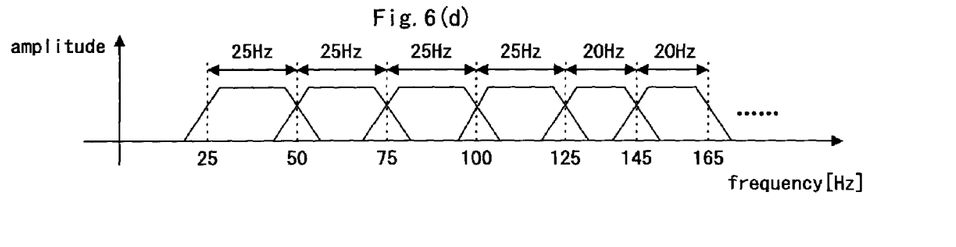
Figure 7A:
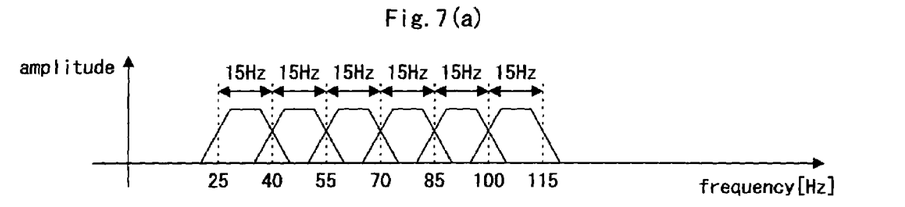
Figure 7B:
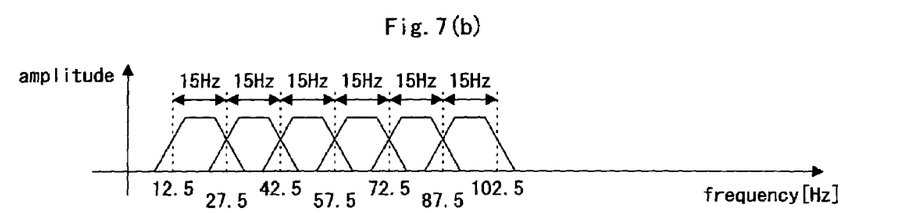
Figure 7C:
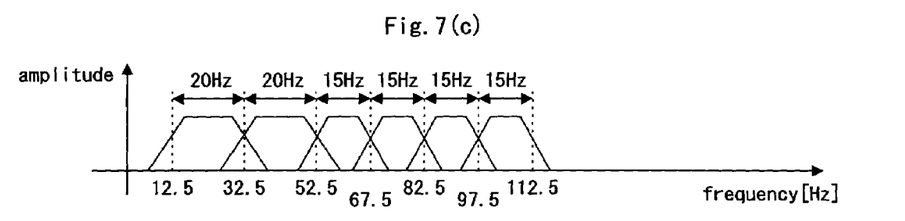
Figure 7D:
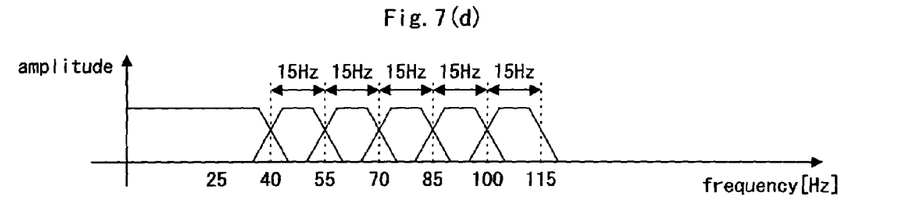

Since the existence of fundamental frequencies of the bandwidth of [0 Hz 27.5 Hz] are few, it is not necessary to take this bandwidth into consideration. Therefore, for the bandwidths [0 Hz 50 Hz 75 Hz 100 Hz 125 Hz] [0 Hz 37.5 Hz 62.5

Hz 87.5 Hz 112.5 Hz] illustrated in FIGS. 6 (*a*) and (*b*) respectively, the lowest band can be a low pass filter. Setting the bandwidth wider than 27.5 Hz is also conceivable. For example, as illustrated shown in FIG. 6 (*c*), a part of the bandwidth can be set to 35 Hz. This decomposition characteristic also fulfills the Condition 1. There are other such examples.

Regarding the decomposition characteristic higher than 150 Hz, if the separation of each Minor 3rd and Major 2nd is possible, sound quality will be improved further.

In an example [25 Hz 50 Hz 75 Hz 100 Hz 125 Hz 145 Hz 165 Hz] illustrated in FIG. 6 (*d*), Minor 3rd is separable, the bandwidth higher than 125 Hz is set to 20 Hz.

It is also possible to make bandwidth narrower than 20 Hz in the above example. For example, as illustrated in FIGS. 7 (*a*) and (*b*), it is also possible to set the bandwidth to 15 Hz. In this case, similarly as in the case described above, the bandwidths do not need to be equal (FIG. 7 (*c*)) and a low pass filter may be used in the lowest region (FIG. 7 (*d*)).

As mentioned above, the sound quality deterioration can be suppressed by generating the harmonic-tone components individually for each pure tone component that includes the complex tone through the band-decomposition process. Setting the decomposition characteristic based on the harmonic-tone composition of musical sound and the low interval limit under the Condition 1 optimizes the decomposition characteristic of the band-decomposition and reduces the circuit scale.

In the explanation above, the lowest fundamental frequency under the Condition 1 has been set to 27.5 Hz, which is the fundamental frequency of a piano. Actually, if the lowest fundamental frequency is set to 30 Hz, the setting adapts to the low interval limit. However, if the lowest fundamental frequency is set to the higher frequency up to 50 Hz in order to reduce cost, such setting is also included in the present invention and has practically sufficient effect. Considering the above fact, it is desirable that the bandwidth in the decomposition characteristic of the band-decomposition unit 13 is in the range from 15 Hz to 50 Hz.

The above description explains the case in which the input-audio-signal is monaural. However, the present invention is also applicable to sources of two or more channels.

Figure 8:
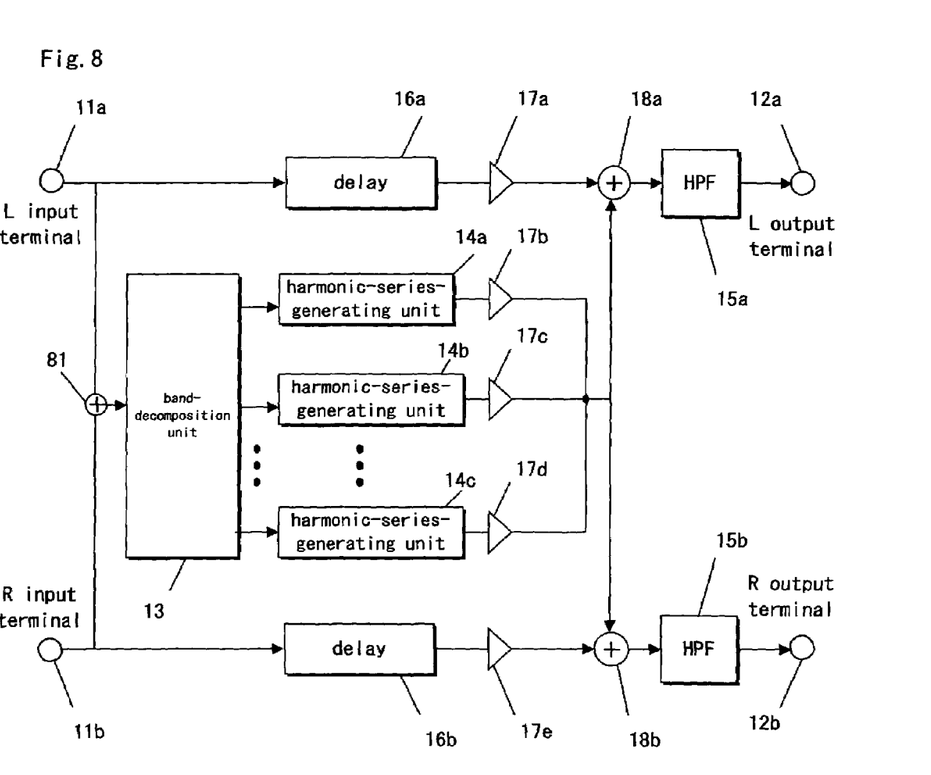
FIG. 8 is a block diagram showing an audio-signal-processing apparatus that corresponds to two channels according to an embodiment of the present invention.

FIG. 8 is a block diagram illustrating an audio-signal-processing apparatus corresponding to two channels according to an embodiment of the present invention. In this figure, the explanation of the same components previously described with reference to FIG. 1 has been omitted.

Since this apparatus corresponds to two channels, the 1st channel (L channel in the figure) and the 2nd channel (R channel in the figure), input terminals 11*a* and 11*b*, delay devices 16*a* and 16*b*, gain controls 17*a* and 17*e*, adders 18*a* and 18*b*, and high-pass filters 15*a* and 15*b* are provided to each channel respectively.

An adder 81 as a sum component output unit inputs the input-audio-signal of the 1st channel and the input-audio-signal of the 2nd channel, and outputs the sum component of these input-audio-signals to a band-decomposition unit 13. Therefore, this band-decomposition unit 13 has a decomposition characteristic, and decomposes the low frequency components of the sum component into a plurality of frequency components that have different frequency bands according to the decomposition characteristic.

The adder 18*a* as a 1st composition unit adds the harmonic-tone components generated by harmonic-series-generating units 14*a*-14*c* and the input-audio-signal of the 1st channel, and outputs them to the high-pass filter 15*a*.

The adder 18*b*, as a 2nd composition unit, adds the harmonic-tone component generated by the harmonic-series-generating units 14*a*-14*c* and the input-audio-signal of the 2nd channel, and outputs them to the high-pass filter 15*b*.

The apparatus shown in FIG. 8 reduces the circuit scale by utilizing the fact that the low frequency components are contained in-phase in each channel in many cases and by processing each channel signal after adding. The examples of two channels (stereo) have been described. However, the present invention is applicable to three channels or more, for example, 5.1 channels and so on.

As an example, the audio-signal-processing apparatus in an embodiment of the present invention is applied to the virtual reproduction system of bass sound that generates the harmonic-tone in the low frequency component. However, this embodiment of the present invention is applicable to various uses such as an effector apparatus and so on, as long as it is an audio-signal-processing apparatus that generates the harmonic-tone.

According to an embodiment of the present invention, a band-decomposition process can generate a harmonic-tone individually to each pure tone component that includes complex tone, reduce distortion, and suppress the sound quality deterioration. Including a decomposition characteristic based on the harmonic-tone composition of musical sound and the low interval limit can optimize the decomposition characteristic of the band-decomposition and can reduce the circuit scale.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An audio-signal-processing apparatus for processing input-audio-signals, each input-audio-signal comprising a musical sound that includes a fundamental-tone having a first frequency, and a harmonic-tone having a second frequency that is an integral multiple frequency of the first frequency, said apparatus comprising:

a band-decomposition unit operable to decompose a low frequency component of the input-audio-signals into a first frequency band and a second frequency band, the first frequency band and the second frequency band being different frequency bands, and the fundamental-tone being included in the first frequency band and the harmonic-tone being included in the second frequency band;

a harmonic-series-generating unit operable to generate a harmonic-tone component for the fundamental-tone included in the first frequency band, and a harmonic-tone component for the harmonic-tone included in the second frequency band; and a composition unit operable to compound the input-audio-signals, the harmonic-tone component for the fundamental-tone in the first frequency band, and the harmonic-tone component for the harmonic-tone included in the second frequency band generated by said harmonic-series-generating unit, wherein a bandwidth of the first frequency band and a bandwidth of the second frequency band are defined based on at least one of a lowest fundamental frequency of the musical sound and a low interval limit.

2. The audio-signal-processing apparatus of claim 1, wherein the bandwidth of the first frequency band and the bandwidth of the second frequency band are from 15 Hz to 50 Hz.

3. The audio-signal-processing apparatus of claim 1, wherein the bandwidth of the first frequency band and the bandwidth of the second frequency band are from 15 Hz to 30 Hz.

4. The audio-signal-processing apparatus of claim 1, wherein said band-decomposition unit comprises a low-pass filter operable to extract frequency components in a lowest register.

5. The audio-signal-processing apparatus of claim 1, wherein said band-decomposition unit comprises a band-pass filter having a low cut-off frequency that is lower than a lowest fundamental frequency of a musical instrument.

6. The audio-signal-processing apparatus of claim 1, further comprising a delay device operable to compensate for a processing delay between the harmonic-tone component for the fundamental-tone included in the first frequency band and the harmonic-tone component for the harmonic-tone included in the second frequency band, and the input-audio-signals.

7. The audio-signal-processing apparatus of claim 1, further comprising a gain control device operable to adjust a gain of the input-audio-signals and a gain of the harmonic-tone component for the fundamental-tone included in the first frequency band and the harmonic-tone component for the harmonic-tone included in the second frequency band generated by said harmonic-series-generating unit.

8. An audio-signal-processing apparatus for processing input-audio-signals, each input-audio-signal comprising a musical sound that includes a fundamental-tone having a first frequency, and a harmonic-tone having a second frequency that is an integral multiple frequency of the first frequency, said apparatus comprising:

a sum component output unit operable to receive input-audio-signals of a first channel and input-audio-signals of a second channel and output a sum component of the input-audio-signals of the first channel and the input-audio-signals of the second channel;

a band-decomposition unit operable to decompose a low frequency component of the input-audio-signals into a first frequency band and a second frequency band, the first frequency band and the second frequency band being different frequency bands, and the fundamental-tone being included in the first frequency band and the harmonic-tone being included in the second frequency band;

a harmonic-series-generating unit operable to generate a harmonic-tone component for the fundamental-tone included in the first frequency band, and a harmonic-tone component for the harmonic-tone included in the second frequency band;

a first composition unit operable to compound the input-audio-signals of the first channel, the harmonic-tone component for the fundamental-tone included in the first frequency band, and the harmonic-tone component for the harmonic-tone included in the second frequency band generated by said harmonic-series-generating unit; and a second composition unit operable to compound the input-audio-signals of the second channel, the harmonic-tone component for the fundamental-tone included in the first frequency band, and the harmonic-tone component for the harmonic-tone included in the second frequency band generated by said harmonic-series-generating unit, wherein a bandwidth of the first frequency band and a bandwidth of second frequency band are defined based on at least one of a lowest fundamental frequency of the musical sound and a low interval limit.

9. An audio-signal-processing method for processing input-audio-signals, each input-audio-signal comprising a musical sound that includes a fundamental-tone with a first frequency, and a harmonic-tone with a second frequency that is an integral multiple frequency of the first frequency, said method comprising:

decomposing a low frequency component of the input-audio-signals into a first frequency band and a second frequency band, the first frequency band and the second frequency band being different frequency bands, and the fundamental-tone being included in the first frequency band and the harmonic-tone being included in the second frequency band;

generating a harmonic-tone component for the fundamental-tone included in the first frequency band, and a harmonic-tone component for the harmonic-tone included in the second frequency band; and compounding the input-audio-signals, the generated harmonic-tone component for the fundamental-tone included in the first frequency band, and the generated harmonic-tone component for the harmonic-tone included in the second frequency band, wherein a bandwidth of the first frequency band and a bandwidth of the second frequency band are defined based on at least one of a lowest fundamental frequency of the musical sound and a low interval limit.

10. The audio-signal-processing method of claim 9, wherein the bandwidth of the first frequency band and the bandwidth of the second frequency band are from 15 Hz to 30 Hz.

11. The audio-signal-processing method of claim 9, wherein said decomposing further comprises decomposing the low frequency component of the input-audio-signals into different frequency bands based on a decomposition characteristic of a low-pass filter operable to extract frequency components in a lowest register.

12. The audio-signal-processing method of claim 9, wherein the bandwidth of the first frequency band and the bandwidth of the second frequency band are from 15 Hz to 50 Hz.

13. The audio-signal-processing method of claim 9, further comprising compensating for a processing delay between the generated harmonic-tone component for the fundamental-tone included in the first frequency band and the harmonic-tone component for the harmonic-tone included in the second frequency band, and the input-audio-signals.

14. The audio-signal-processing method of claim 9, further comprising adjusting a gain of the input-audio-signals and a gain of the generated harmonic-tone component for the fundamental-tone included in the first frequency band and the harmonic-tone component for the harmonic-tone included in the second frequency band.

* * * * *